(12) United States Patent
Zhou et al.

(10) Patent No.: US 10,194,565 B2
(45) Date of Patent: Jan. 29, 2019

(54) ELECTROMAGNETIC INTERFERENCE SHIELDING APPARATUS

(71) Applicant: Cisco Technology, Inc., San Jose, CA (US)

(72) Inventors: Xiaoxia Zhou, Shanghai (CN); Hailong Zhang, Shanghai (CN); Jianquan Lou, Shanghai (CN); Huasheng Zhao, Shanghai (CN); Luli Gong, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/613,642

(22) Filed: Jun. 5, 2017

(65) Prior Publication Data

US 2018/0352687 A1 Dec. 6, 2018

(51) Int. Cl.
H05K 9/00 (2006.01)
*H01R 13/6581* (2011.01)
*H01R 13/6582* (2011.01)

(52) U.S. Cl.
CPC ....... *H05K 9/0007* (2013.01); *H01R 13/6581* (2013.01); *H01R 13/6582* (2013.01)

(58) Field of Classification Search
CPC .................. H01R 13/6581; H01R 13/6582
See application file for complete search history.

(56) References Cited

U.S. PATENT DOCUMENTS

| | | | |
|---|---|---|---|
| 5,207,597 A | 5/1993 | Kline et al. | |
| 5,708,745 A | 1/1998 | Yamaji et al. | |
| 6,039,585 A | 3/2000 | Kim et al. | |
| 6,351,394 B1 | 2/2002 | Cunningham | |
| 6,752,663 B2 | 6/2004 | Bright et al. | |
| 6,816,376 B2 * | 11/2004 | Bright .................. | G02B 6/4201 361/704 |
| 9,620,906 B1 | 4/2017 | Briant et al. | |
| 2001/0049214 A1 * | 12/2001 | Billman ............. | H01R 13/6485 439/138 |

(Continued)

FOREIGN PATENT DOCUMENTS

| | | |
|---|---|---|
| DE | 19601949 A1 | 8/1996 |
| JP | S63307408 | 12/1988 |
| WO | 2006/007120 A1 | 1/2006 |

OTHER PUBLICATIONS

International Search Report and Written Opinion in counterpart International Application No. PCT/US2018/034834, dated Sep. 10, 2018, 13 pages.

*Primary Examiner* — Hung V Ngo
(74) *Attorney, Agent, or Firm* — Edell, Shapiro & Finnan, LLC

(57) ABSTRACT

An electromagnetic interference (EMI) shielding apparatus includes a cage structure having an opening at a first end and a second end opposite to first end. The cage structure is configured to contain one or more electrical components that emit electromagnetic energy and a connector for the one or more electrical components. The first end is configured to receive a pluggable module that is to connect to the one or more electrical components. The EMI shielding apparatus further includes a filler assembly disposed in the opening. The filler assembly is biased to close the opening of the cage structure when a pluggable module is not inserted/plugged in the opening.

20 Claims, 5 Drawing Sheets

(56) References Cited

U.S. PATENT DOCUMENTS

| | | |
|---|---|---|
| 2002/0118931 A1 | 8/2002 | Ohbayashi et al. |
| 2007/0117458 A1 | 5/2007 | Winker et al. |
| 2013/0048367 A1 | 2/2013 | Ljubijankic |
| 2013/0051738 A1 | 2/2013 | Ito |
| 2014/0305689 A1 | 10/2014 | Reeves |
| 2016/0218455 A1* | 7/2016 | Sayre ................. H01R 13/6594 |
| 2017/0059799 A1 | 3/2017 | Gupta et al. |

* cited by examiner

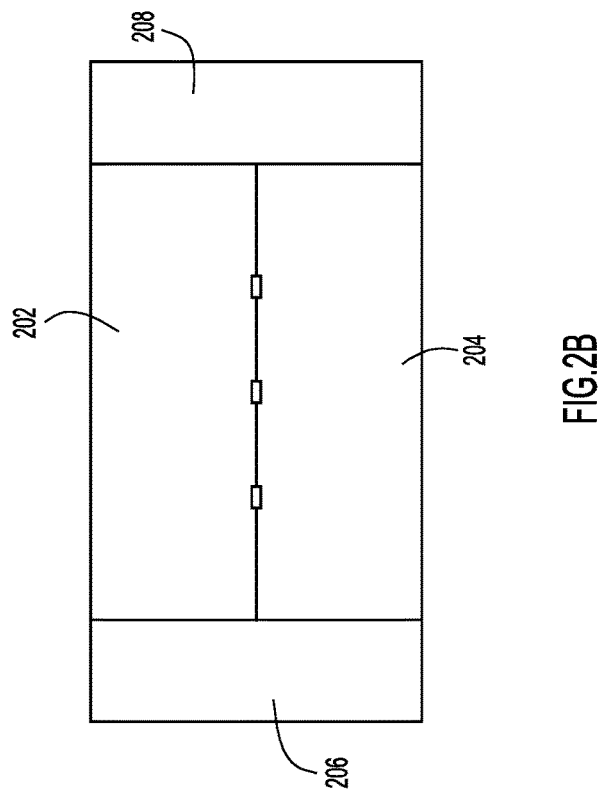
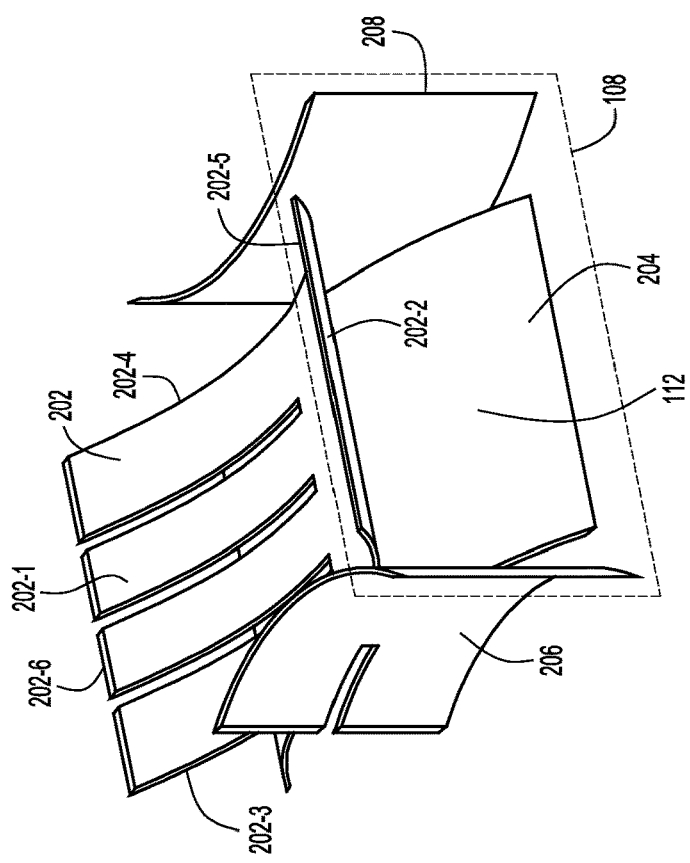

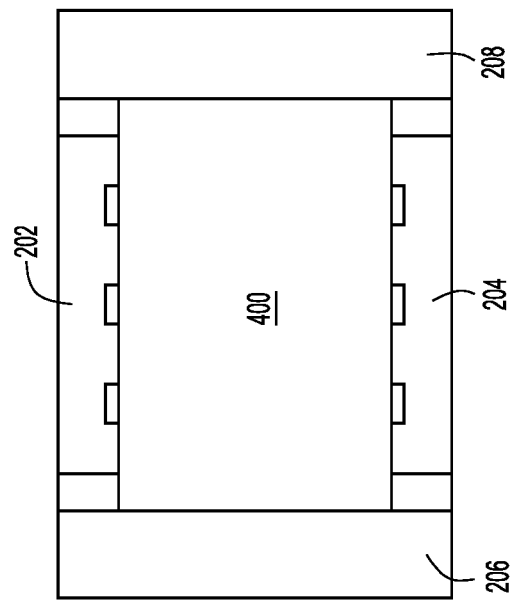
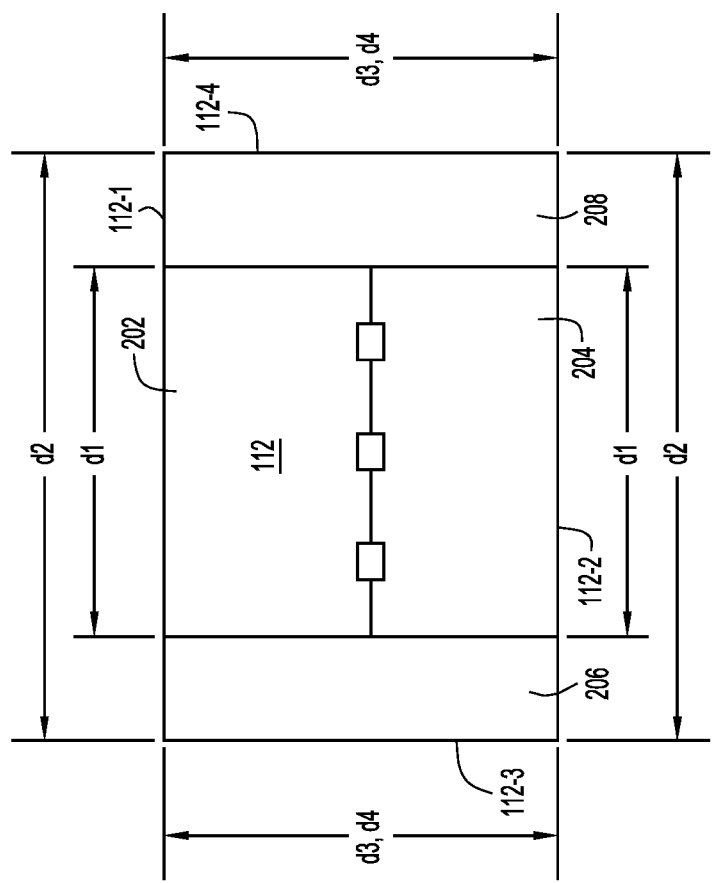
FIG.4B
FIG.4A

ELECTROMAGNETIC INTERFERENCE SHIELDING APPARATUS

TECHNICAL FIELD

The present disclosure relates to an electromagnetic interference shielding apparatus.

BACKGROUND

Board level Electromagnetic Interference (EMI) noise could be emitted from optical cages when the optics modules are unplugged from ports of the optical cages. This can cause serious failure issues. One solution is to insert blank modules into unoccupied optical cages. The blank modules are metal parts that have to establish good contact with optical cages. However, a user may forget to install blank modules or use plastic blank modules for unplugged optical ports of optical cages, which may result in failure issues due to EMI.

BRIEF DESCRIPTION OF THE DRAWINGS

FIGS. 2A and 2B depict a side perspective view and a front view, respectively, of a filler assembly for a cage structure of the EMI shielding apparatus, according to an example embodiment.

FIG. 4A depicts a front view of the EMI shielding apparatus without a pluggable module and showing how the filler assembly is biased to seal the cage structure to prevent or minimize EMI leakage from the cage assembly, according to an example embodiment.

FIG. 4B is a front view of the EMI shielding apparatus with a pluggable module inserted into the cage structure and showing how the filler assembly flexes around the pluggable module, according to an example embodiment.

DESCRIPTION OF EXAMPLE EMBODIMENTS

Overview

In one embodiment, an electromagnetic interference (EMI) shielding apparatus is provided that includes a cage structure having an opening at a first end and a second end opposite to first end. The cage structure is configured to contain one or more electrical components that emit electromagnetic energy and a connector for the one or more electrical components. The first end is configured to receive a pluggable module that is to connect to the one or more electrical components. The EMI shielding apparatus further includes a filler assembly disposed in the opening. The filler assembly is biased to close the opening of the cage structure when a pluggable module is not plugged into the opening so as to reduce EMI from the one or more electronics in housed in the cage structure.

Example Embodiments

Presented herein is an apparatus that can reduce EMI in an electronic system. Example embodiments are described herein with references to the figures.

Figure 1B:
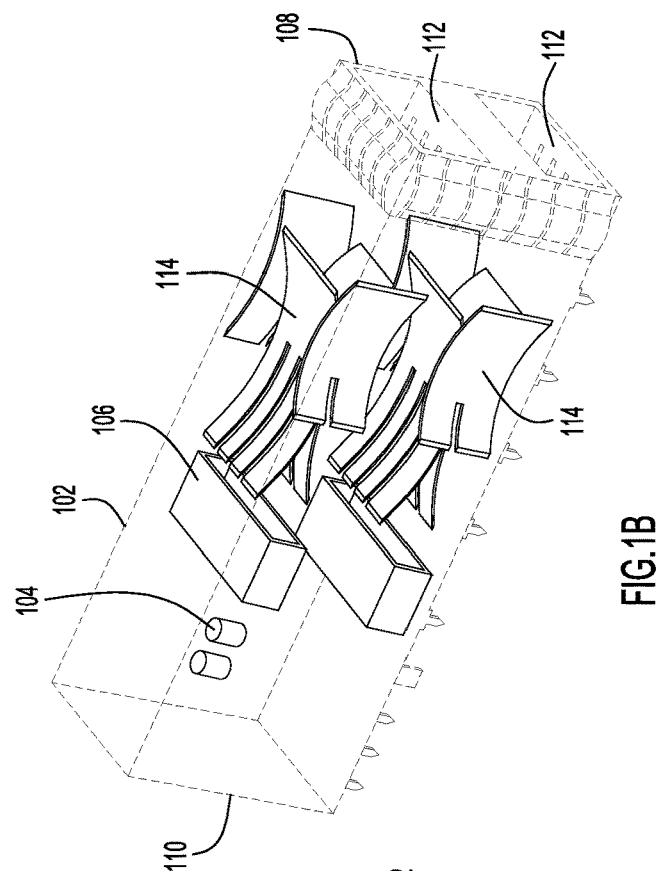
FIGS. 1A and 1B depict a side perspective view and a transparent view, respectively, of an EMI shielding apparatus according to an example embodiment.
Figure 1A:
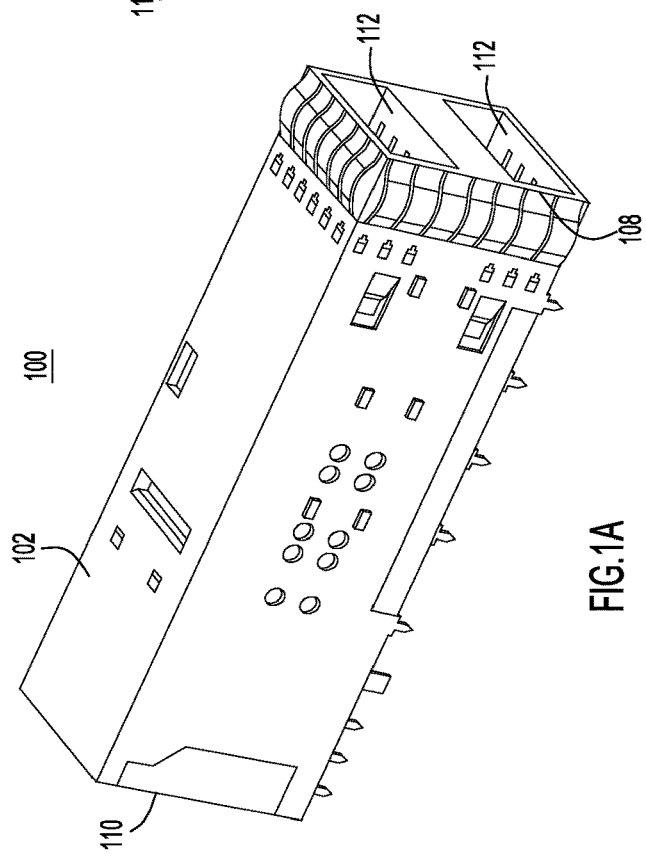

FIGS. 1A and 1B depict an EMI shielding apparatus 100 according to an example embodiment. The EMI shielding apparatus 100 includes a cage structure 102 that houses one or more electronic components 104 that may emit electromagnetic energy. In one embodiment, the one or more electronic components are embodied as a host module (one or more integrated circuit cards mounted on one or more boards along with supporting components) used in an optical node. The cage structure 102 further houses a connector (or multiple connectors) 106 for the one or more electronic components 104. The cage structure 102 has a first end 108 and a second end 110 opposite to the first end 108. The first end 108 includes one or more openings 112 configured to receive a pluggable module that is to connect to the one or more electrical components 104 through the connector 106. In one example, the pluggable module (not shown) is an optics module that is to connect to the aforementioned host module housed in the cage structure 102. As shown in FIGS. 1A and 1B, the example cage structure 102 includes two openings 112 at the first end 108. Thus, the cage structure 102 may house two host modules and allow for receiving two pluggable optics modules, one into each of the two openings 112. Although two openings are illustrated here, it is to be understood that an EMI shielding apparatus may include any number of openings.

The EMI shielding apparatus 100 further includes a filler assembly 114 disposed in each of the openings 112. Because the EMI shielding apparatus 100 has two openings 112 at the first end 108, FIG. 1B shows two filler assemblies 114. Each of the filler assemblies 114 is biased to close a respective opening 112 of the cage structure 102 when a pluggable module is not plugged in the opening 112. It is to be understood that the EMI shielding apparatus 100 may include other components or structures not shown in the figures.

With reference to FIGS. 2A and 2B, detail structures of the filler assembly 114 will be provided below. FIGS. 2A and 2B shows an oblique view and a front view of a filler assembly 114, respectively, according to example embodiments. The filler assembly 114 includes a first sheet spring member 202, a second sheet spring member 204, a third sheet spring member 206, and a fourth sheet spring member 208. The first sheet spring member 202 extends from the first end 108 into the opening 112. The second sheet spring member 204 opposes and abuts the first sheet spring member 202. The second sheet spring member 204 extends from the first end 108 into the opening 112. The third sheet spring member 206 abuts the first sheet spring member 202 and the second sheet spring member 204. The third sheet spring member 206 extends from the first end 108 into the opening 112. The fourth sheet spring member 208 abuts the first sheet spring member 202 and the second sheet spring member 204. The fourth sheet spring member 208 extends from the first end 108 into the opening 112 and is separated from the third sheet spring member 206 by the first sheet spring member 202 and the second sheet spring member 204. As such, the first sheet spring member 202, the second sheet spring member 204, the third sheet spring member 206, and the fourth sheet spring member 208 are biased to close the opening 112 so as to reduce EMI.

Each of the first sheet spring member 202, the second sheet spring member 204, the third sheet spring member 206, and the fourth sheet spring member 208 includes two opposing surfaces, two opposing lateral sides, a front side, and a back side. For simplicity, these opposing surfaces 202-1 and 202-2, opposing lateral sides 202-3 and 202-4, front side 202-5, and back side 202-6 are illustrated for the first sheet spring member 202 in FIG. 2A, although other sheet spring members also have such similar features. As shown in FIG. 2B, a surface of the first sheet spring member 202 abuts a surface of the second sheet spring member 204. A surface of the third sheet spring member 206 abuts a lateral side of the first sheet spring member 202 and a lateral side of the second sheet spring member 204. A surface of the fourth sheet spring member 208 abuts a lateral side of the first sheet spring member 202 and a lateral side of the second sheet spring member 204.

In some embodiments, the filler assembly 114 is made of conductive materials, such as metal.

Figure 3:
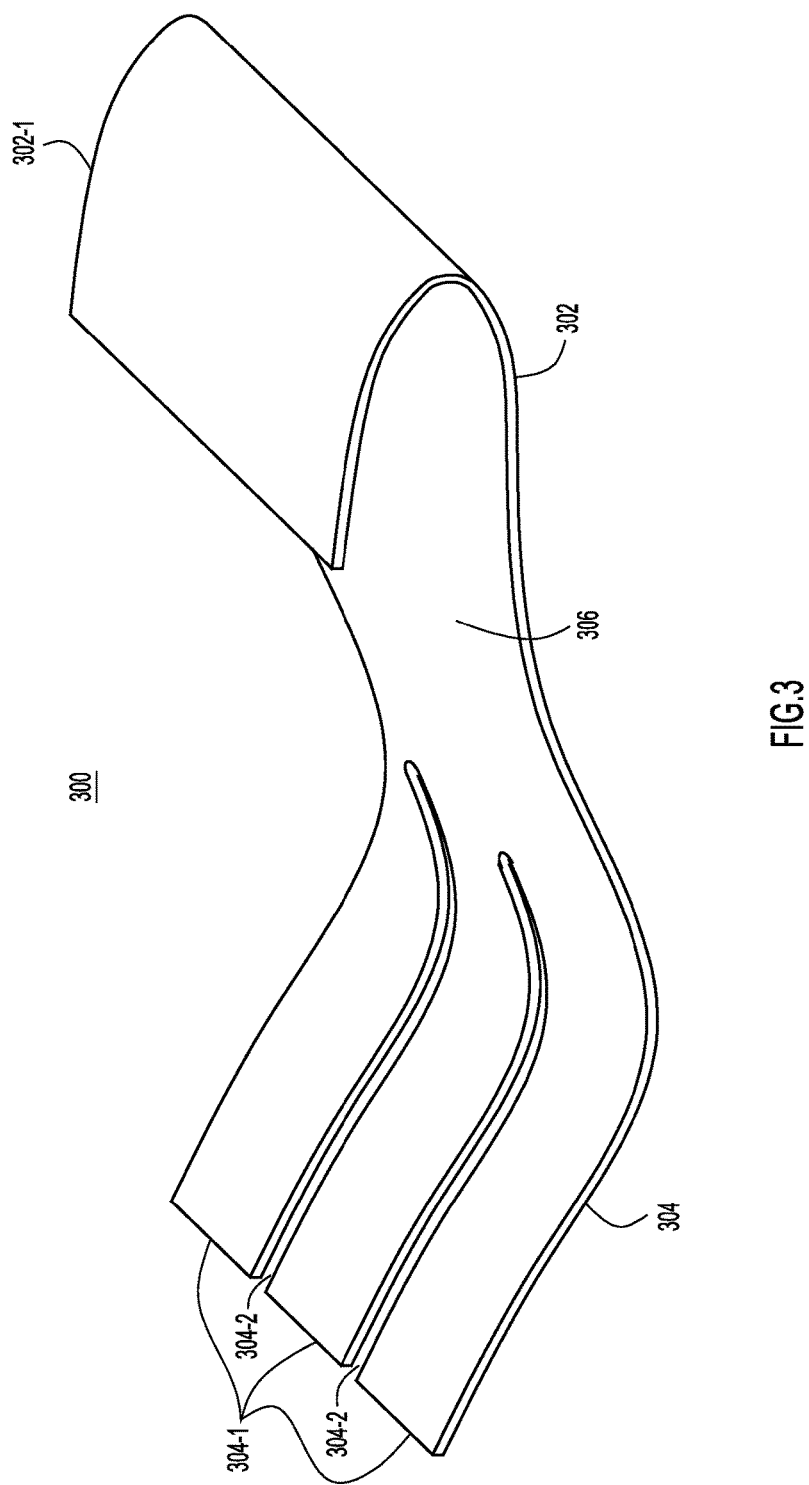
FIG. 3 depicts an oblique view of a sheet spring member used in the filler assembly, according to an example embodiment.

FIG. 3 shows an oblique view of a sheet spring member 300 according to an example embodiment. The sheet spring member 300 may be used for any one of the first sheet spring member 202, the second sheet spring member 204, the third sheet spring member 206, or the fourth sheet spring member 208 in FIGS. 2A and 2B. The sheet spring member 300 includes an end portion 302, a spring finger portion 304, and an extension portion 306 interposed between the end portion 302 and the spring finger portion 304. The end portion 302 may include a folded portion 302-1 configured to couple the sheet spring member 300 to an edge of the opening 112 of the cage structure 102 (FIGS. 1A and 1B). The spring finger portion 304 includes a plurality of spring fingers 304-1. The plurality of spring fingers 304-1 are separated by gaps 304-2 and joined to each other at the extension portion 306. As shown in FIGS. 2A and 2B, the spring fingers of the first sheet spring member 202 abut the spring fingers of the second sheet spring member 204.

In some embodiments, the first sheet spring member 202 and the second spring member 204 extend further into the opening 112 than the third sheet spring member 206 and the fourth spring member 208 as shown in FIGS. 1B and 2A. This structure allows the filler assembly 114 to more effectively block electromagnetic energy from being emitted from the cage structure 102.

FIG. 4A shows a front view of the EMI shielding apparatus 100 looking at the first end 108 of the cage structure 102 when no pluggable module is plugged into the opening 112, according to an example embodiment. FIG. 4B shows a front view of the EMI shielding apparatus 100 looking at the first end 108 of the cage structure 102 when a pluggable module 400 is plugged into the opening 112, according to another example embodiment. As shown in FIG. 4A, when there is no pluggable module inserted in the opening 112, the filler assembly 114 including the sheet spring members 202, 204, 206, and 208 are biased to fill in and close the opening 112.

Specifically, the first sheet spring member 202 is coupled to a first edge 112-1 of the opening 112. The first sheet spring member 202 has a width d1 less than a width d2 of the first edge 112-1. The second sheet spring member 204 is coupled to a second edge 112-2 of the opening 112. The second sheet spring member 204 has a width d1 less than a width d2 of the second edge 112-2. The third sheet spring member 206 is coupled to a third edge 112-3 of the opening 112. The third sheet spring member 204 has a width d3 substantially equal to a width d4 of the third edge 112-3. The fourth sheet spring member 208 is coupled to a fourth edge 112-4 of the opening 112. The fourth sheet spring member 204 has a width d3 substantially equal to a width d4 of the fourth edge 112-4. In some embodiments, a ratio of the width d1 of the first sheet spring member 202 to the width d2 of the first edge 112-1 of the opening 112 is about 60-90%. A ratio of the width d3 of the third sheet spring member 206 to the width d4 of the third edge 112-3 of the opening 112 is about 80-100%. In some embodiment, a ratio of the width d1 of the first sheet spring member 202 to the width d2 of the first edge 112-1 of the opening 112 is less than a ratio of the width d3 of the third sheet spring member 206 to the width d4 of the third edge 112-3 of the opening 112. The edges of the opening 112 form a square or rectangle. Thus, any two adjacent edges are generally orthogonal to each other.

Referring to FIG. 4B, when the pluggable module 400 is inserted into the opening 112, each of the sheet spring members 202, 204, 206, and 208 flexes and is deformed causing them to be pushed toward a respective, corresponding edge of the opening 112.

In some embodiments, the EMI shielding apparatus disclosed herein can be employed in a Quad Small Form-factor Pluggable (QSFP) cage, or other optical and electrical connection applications.

Figure 5:
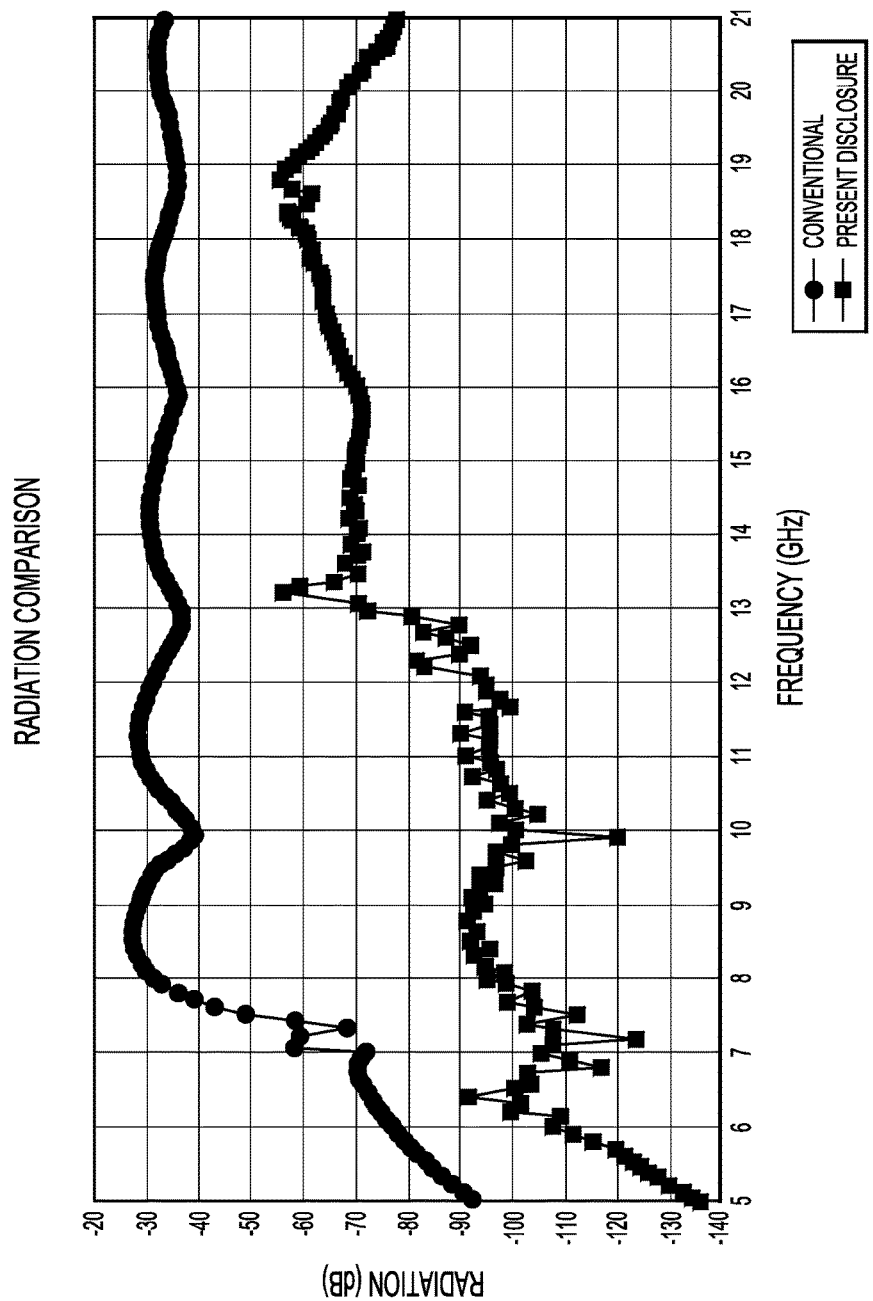
FIG. 5 is a plot showing a comparison of electromagnetic radiation from a conventional EMI shielding apparatus and electromagnetic radiation from an EMI shielding apparatus according to embodiments presented herein.

FIG. 5 is a graphical plot showing a comparison of electromagnetic radiation from a conventional EMI shielding apparatus and electromagnetic radio from an EMI shielding apparatus according to embodiments of the present disclosure. As can be seen in FIG. 5, the radiation from the EMI shielding apparatus according to embodiments of the present disclosure is less than that of the convention EMI shielding apparatus across all measured frequencies.

The various embodiments of EMI shielding apparatus disclosed herein provide better EMI shielding even if a user neglects to insert a blank module into the cage opening. The filler assembly is configured/biased to close the opening in the cage structure (when nothing is inserted in the opening of the cage structure) so that a user is not required to insert blank module into the cage structure. This reduces the costs associated with a blank module to be inserted into cage when a pluggable module is removed for whatever reason. The EMI shielding apparatus disclosed herein is user-friendly and provides more flexibility to deploy in a cage structure. In addition, the EMI shielding apparatus disclosed herein provides improved EMI shielding when a pluggable module is inserted into the cage structure due to the improved sealing around the inserted pluggable module. That is, the EMI shielding apparatus according to the embodiments presented herein provides improved EMI shielding both when the pluggable modules are inserted into the cage and when the pluggable modules are not inserted into the cage. Moreover, because the filler assembly closes the opening in the cage structure, the filler assembly prevents dust from entering into the opening, reducing potential connection failure problems.

In summary, in one aspect, an EMI shielding apparatus is provided which includes a cage structure having an opening at a first end and a second end opposite to the first end. The cage structure is configured to contain one or more electrical components that emit electromagnetic energy and a connector for the one or more electrical components. The first end is configured to receive a pluggable module that is to connect to the one or more electrical components. The EMI shielding apparatus further includes a filler assembly disposed in the opening, wherein the filler assembly is biased to close the opening of the cage structure when the pluggable module is not inserted in the opening.

The filler assembly may include: a first sheet spring member extending from the first end into the opening; a second sheet spring member opposing and abutting the first sheet spring member, the second sheet spring member extending from the first end into the opening; a third sheet spring member abutting the first sheet spring member and the second sheet spring member, the third sheet spring member extending from the first end into the opening; and a fourth sheet spring member abutting the first sheet spring member and the second sheet spring member, the fourth sheet spring member extending from the first end into the opening and being separated from the third sheet spring member by the first sheet spring member and the second sheet spring member.

In one form, each of the first, second, third, and fourth sheet spring members includes two opposing surfaces and two opposing sides; a surface of the first sheet spring member abuts a surface of the second sheet spring member; a surface of the third sheet spring member abuts a side of the first sheet spring member and a side of the second sheet spring member; and a surface of the fourth sheet spring member abuts a side of the first sheet spring member and a side of the second sheet spring member. Each of the first, second, third, and fourth sheet spring members may include: an end portion coupled to the first end of the cage structure; a plurality of spring fingers; and an extension portion interposed between the end portion and the plurality of spring fingers. The plurality of spring fingers of the first sheet spring member may abut the plurality of spring fingers of the second sheet spring member.

In one form, the first sheet spring member and second sheet spring member extend further into the opening of the cage structure than the third sheet spring member and the fourth sheet spring member.

In one form, the first sheet spring member is coupled to a first edge of the opening and the third sheet spring member is coupled to a second edge of the opening, the first edge being orthogonal to the second edge; a width of the first sheet spring member is substantially less than a width of the first edge of the opening; and a width of the third sheet spring member is substantially equal to a width of the second edge of the opening. In one example, a ratio of the width of the first sheet spring member to the width of the first edge of the opening is less than a ratio of the width of the third sheet spring member to the width of the second edge of the opening.

In another aspect, an EMI shielding apparatus is provided which includes a cage structure having an opening at a first end and a second end opposite to the first end. The cage structure is configured to contain one or more electrical components that emit electromagnetic energy and a connector for the one or more electrical components. The first end is configured to receive a pluggable module that is to connect to the one or more electrical components. The EMI shielding apparatus further includes a filler assembly disposed in the opening. The filler assembly includes: a first sheet spring member extending from the first end into the opening; a second sheet spring member opposing and abutting the first sheet spring member, the second sheet spring member extending from the first end into the opening; a third sheet spring member abutting the first sheet spring member and the second sheet spring member, the third sheet spring member extending from the first end into the opening; and a fourth sheet spring member abutting the first sheet spring member and the second sheet spring member, the fourth sheet spring member extending from the first end into the opening and being separated from the third sheet spring member by the first sheet spring member and the second sheet spring member.

In another aspect, an EMI shielding apparatus is provided which includes a cage structure having an opening at a first end and a second end opposite to the first end. The cage structure is configured to contain one or more electrical components that emit electromagnetic energy and a connector for the one or more electrical components. The first end is configured to receive a pluggable module that is to connect to the one or more electrical components. The opening includes a first edge, a second edge, a third edge, and a fourth edge. The EMI shielding apparatus further includes a filler assembly disposed in the opening. The filler assembly includes: a first sheet spring member extending from the first end into the opening and coupled to the first edge of the opening; a second sheet spring member opposing and abutting the first sheet spring member, the second sheet spring member extending from the first end into the opening and coupling to the second edge of the opening; a third sheet spring member abutting the first sheet spring member and the second sheet spring member, the third sheet spring member extending from the first end into the opening and coupled to the third edge of the opening; and a fourth sheet spring member abutting the first sheet spring member and the second sheet spring member, the fourth sheet spring member extending from the first end into the opening and coupled to the fourth edge of the opening, the fourth sheet spring member being separated from the third sheet spring member by the first sheet spring member and the second sheet spring member. The first sheet spring member has a width less than a width of the first edge of the opening. The second sheet spring member has a width less than a width of the second edge of the opening. The third sheet spring member has a width substantially equal to than a width of the third edge of the opening. The fourth sheet spring member has a width substantially equal to than a width of the fourth edge of the opening.

The above description is intended by way of example only. Various modifications and structural changes may be made therein without departing from the scope of the concepts described herein and within the scope and range of equivalents of the claims.

What is claimed is:

1. An electromagnetic interference (EMI) shielding apparatus comprising:
    a cage structure having an opening at a first end and a second end opposite to the first end, and configured to contain one or more electrical components that emit electromagnetic energy and a connector for the one or more electrical components, wherein the first end is configured to receive a pluggable module that is to connect to the one or more electrical components; and
    a filler assembly disposed in the opening, wherein the filler assembly includes a plurality of sheet spring members extending from the first end into the opening, the plurality of sheet spring members being biased against each other to fully close the opening of the cage structure when the pluggable module is not inserted in the opening.

2. The EMI shielding apparatus of claim 1, wherein the plurality of sheet spring members comprises:
    a first sheet spring member extending from the first end into the opening;
    a second sheet spring member opposing and abutting the first sheet spring member, the second sheet spring member extending from the first end into the opening;
    a third sheet spring member abutting the first sheet spring member and the second sheet spring member, the third sheet spring member extending from the first end into the opening; and
    a fourth sheet spring member abutting the first sheet spring member and the second sheet spring member, the fourth sheet spring member extending from the first end into the opening and being separated from the third sheet spring member by the first sheet spring member and the second sheet spring member.

3. The EMI shielding apparatus of claim 2, wherein:
each of the first, second, third, and fourth sheet spring members includes two opposing surfaces and two opposing sides;
a surface of the first sheet spring member abuts a surface of the second sheet spring member;
a surface of the third sheet spring member abuts a side of the first sheet spring member and a side of the second sheet spring member; and
a surface of the fourth sheet spring member abuts a side of the first sheet spring member and a side of the second sheet spring member.

4. The EMI shielding apparatus of claim 2, wherein each of the first, second, third, and fourth sheet spring members includes:
an end portion coupled to the first end of the cage structure;
a plurality of spring fingers; and
an extension portion interposed between the end portion and the plurality of spring fingers.

5. The EMI shielding apparatus of claim 4, wherein the plurality of spring fingers of the first sheet spring member abuts the plurality of spring fingers of the second sheet spring member.

6. The EMI shielding apparatus of claim 2, wherein the first sheet spring member and second sheet spring member extend further into the opening of the cage structure than the third sheet spring member and the fourth sheet spring member.

7. The EMI shielding apparatus of claim 2, wherein:
the first sheet spring member is coupled to a first edge of the opening and the third sheet spring member is coupled to a second edge of the opening, the first edge being orthogonal to the second edge;
a width of the first sheet spring member is substantially less than a width of the first edge of the opening; and
a width of the third sheet spring member is substantially equal to a width of the second edge of the opening.

8. The EMI shielding apparatus of claim 7, wherein a ratio of the width of the first sheet spring member to the width of the first edge of the opening is less than a ratio of the width of the third sheet spring member to the width of the second edge of the opening.

9. An electromagnetic interference (EMI) shielding apparatus comprising:
a cage structure having an opening at a first end and a second end opposite to the first end, and configured to contain one or more electrical components that emit electromagnetic energy and a connector for the one or more electrical components, wherein the first end is configured to receive a pluggable module that is to connect to the one or more electrical components; and
a filler assembly disposed in the opening, wherein the filler assembly includes:
a first sheet spring member extending from the first end into the opening;
a second sheet spring member opposing and abutting the first sheet spring member, the second sheet spring member extending from the first end into the opening;
a third sheet spring member abutting the first sheet spring member and the second sheet spring member, the third sheet spring member extending from the first end into the opening; and
a fourth sheet spring member abutting the first sheet spring member and the second sheet spring member, the fourth sheet spring member extending from the first end into the opening and being separated from the third sheet spring member by the first sheet spring member and the second sheet spring member.

10. The EMI shielding apparatus of claim 9, wherein:
each of the first, second, third, and fourth sheet spring members includes two opposing surfaces and two opposing sides;
a surface of the first sheet spring member abuts a surface of the second sheet spring member;
a surface of the third sheet spring member abuts a side of the first sheet spring member and a side of the second sheet spring member; and
a surface of the fourth sheet spring member abuts a side of the first sheet spring member and a side of the second sheet spring member.

11. The EMI shielding apparatus of claim 9, wherein each of the first, second, third, and fourth sheet spring members includes:
an end portion coupled to the first end of the cage structure;
a plurality of spring fingers; and
an extension portion interposed between the end portion and the plurality of spring fingers.

12. The EMI shielding apparatus of claim 11, wherein the plurality of spring fingers of the first sheet spring member abuts the plurality of spring fingers of the second sheet spring member.

13. The EMI shielding apparatus of claim 9, wherein the first sheet spring member and second sheet spring member extend further into the opening of the cage structure than the third sheet spring member and the fourth sheet spring member.

14. The EMI shielding apparatus of claim 9, wherein:
the first sheet spring member is coupled to a first edge of the opening and the third sheet spring member is coupled to a second edge of the opening, the first edge being orthogonal to the second edge;
a width of the first sheet spring member is substantially less than a width of the first edge of the opening; and
a width of the third sheet spring member is substantially equal to a width of the second edge of the opening.

15. The EMI shielding apparatus of claim 14, wherein a ratio of the width of the first sheet spring member to the width of the first edge of the opening is less than a ratio of the width of the third sheet spring member to the width of the second edge of the opening.

16. An electromagnetic interference (EMI) shielding apparatus comprising:
a cage structure having an opening at a first end and a second end opposite to the first end, and configured to contain one or more electrical components that emit electromagnetic energy and a connector for the one or more electrical components, wherein the first end is configured to receive a pluggable module that is to connect to the one or more electrical components, wherein the opening includes a first edge, a second edge, a third edge, and a fourth edge; and
a filler assembly disposed in the opening, wherein the filler assembly includes:
a first sheet spring member extending from the first end into the opening and coupled to the first edge of the opening;
a second sheet spring member opposing and abutting the first sheet spring member, the second sheet spring member extending from the first end into the opening and coupling to the second edge of the opening;

a third sheet spring member abutting the first sheet spring member and the second sheet spring member, the third sheet spring member extending from the first end into the opening and coupled to the third edge of the opening; and a fourth sheet spring member abutting the first sheet spring member and the second sheet spring member, the fourth sheet spring member extending from the first end into the opening and coupled to the fourth edge of the opening, the fourth sheet spring member being separated from the third sheet spring member by the first sheet spring member and the second sheet spring member, wherein the first sheet spring member has a width less than a width of the first edge of the opening, the second sheet spring member has a width less than a width of the second edge of the opening, the third sheet spring member has a width substantially equal to than a width of the third edge of the opening, and the fourth sheet spring member has a width substantially equal to than a width of the fourth edge of the opening.

17. The EMI shielding apparatus of claim 16, wherein:
each of the first, second, third, and fourth sheet spring members includes two opposing surfaces and two opposing sides;

a surface of the first sheet spring member abuts a surface of the second sheet spring member;

a surface of the third sheet spring member abuts a side of the first sheet spring member and a side of the second sheet spring member; and a surface of the fourth sheet spring member abuts a side of the first sheet spring member and a side of the second sheet spring member.

18. The EMI shielding apparatus of claim 16, wherein each of the first, second, third, and fourth sheet spring members includes:

an end portion coupled to a respective edge of the opening;

a plurality of spring fingers; and an extension portion interposed between the end portion and the plurality of spring fingers.

19. The EMI shielding apparatus of claim 18, wherein the plurality of spring fingers of the first sheet spring member abuts the plurality of spring fingers of the second sheet spring member.

20. The EMI shielding apparatus of claim 16, wherein a ratio of the width of the first sheet spring member to the width of the first edge of the opening is less than a ratio of the width of the third sheet spring member to the width of the second edge of the opening.

* * * * *